United States Patent
Huang

(10) Patent No.: US 11,635,913 B2
(45) Date of Patent: Apr. 25, 2023

(54) NOR FLASH MEMORY APPARATUS AND RECOVER AND READ METHOD THEREOF

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 226 days.

(21) Appl. No.: 15/838,356

(22) Filed: Dec. 12, 2017

(65) Prior Publication Data

US 2019/0179566 A1 Jun. 13, 2019

(51) Int. Cl.
*G06F 3/06* (2006.01)
*G11C 16/26* (2006.01)
*G11C 16/34* (2006.01)
*G11C 16/10* (2006.01)
*G11C 16/22* (2006.01)
(Continued)

(52) U.S. Cl.
CPC ............ *G06F 3/0659* (2013.01); *G06F 3/065* (2013.01); *G06F 3/0619* (2013.01); *G06F 3/0625* (2013.01); *G06F 3/0679* (2013.01); *G11C 16/08* (2013.01); *G11C 16/10* (2013.01); *G11C 16/225* (2013.01); *G11C 16/26* (2013.01); *G11C 16/30* (2013.01); *G11C 16/3418* (2013.01); *G11C 2211/5646* (2013.01)

(58) Field of Classification Search
CPC .... G06F 3/0679; G06F 3/0659; G06F 3/0619; G06F 3/0625; G06F 3/065; G06F 12/0246

See application file for complete search history.

(56) References Cited

U.S. PATENT DOCUMENTS 6,104,635 A * 8/2000 Ogane .................. G11C 7/1051
365/185.04
6,198,342 B1 * 3/2001 Kawai .................. H02M 3/073
327/536

(Continued)

FOREIGN PATENT DOCUMENTS

CN 101552038 10/2009
CN 101740127 6/2010
(Continued)

OTHER PUBLICATIONS

Memories in Wireless Systems; Chapter 2 by Crippa (Micheloni) (Year: 2008).*

(Continued)

*Primary Examiner* — Paul M Knight
(74) *Attorney, Agent, or Firm* — JCIPRNET

(57) ABSTRACT

A NOR flash memory apparatus and a recover and read method for the NOR flash memory apparatus are described. The recover and read method includes: operating a power-up process on the NOR flash memory apparatus during a power-up time period; operating a power-up reading operation and reading a mark bit of a memory block of the flash memory apparatus during a reading time period after the power-up time period; and, applying a negative voltage to a plurality of un-selected word lines for the power-up reading operation to operate without leakage current from bit lines of the memory block being caused and therefore to operate normally without causing mistakes.

20 Claims, 5 Drawing Sheets

(51) Int. Cl.
*G11C 16/08* (2006.01)
*G11C 16/30* (2006.01)

(56) References Cited

U.S. PATENT DOCUMENTS

| | | | |
|---|---|---|---|
| 8,307,148 B2 | 11/2012 | Rogers et al. | |
| 8,804,436 B1* | 8/2014 | Chan | G11C 16/3431 |
| | | | 365/185.22 |
| 2009/0244976 A1* | 10/2009 | Kajimoto | G11C 11/5628 |
| | | | 365/185.11 |
| 2010/0118606 A1* | 5/2010 | Lee | G11C 16/3427 |
| | | | 365/185.03 |
| 2016/0012884 A1* | 1/2016 | Toda | G11C 13/0069 |
| | | | 365/148 |

FOREIGN PATENT DOCUMENTS

| | | |
|---|---|---|
| CN | 101783176 | 7/2010 |
| CN | 104051005 | 9/2014 |
| TW | I459203 | 11/2014 |

OTHER PUBLICATIONS

A Wordline Voltage Management for NOR Type Flash Memories by Sinha (Year: 2014).*
High-Voltage Transistor Scaling Circuit Techniques for High-Density Negative-Gate Channel-Erasing NOR Flash Memories by Tanzawa (Year: 2002).*
Reliability of erasing operation in NOR-Flash memories by Chimenton (Year: 2005).*

* cited by examiner

US 11,635,913 B2

1

NOR FLASH MEMORY APPARATUS AND RECOVER AND READ METHOD THEREOF

BACKGROUND

Field of the Invention

The invention relates to a recover and read method for a NOR flash memory apparatus. Particularly, the invention relates to a recover and read method for preventing leakage current from bit lines of the NOR flash memory apparatus.

Description of Related Art

The following refers to FIG. 1, which is a schematic diagram of a conventional NOR flash memory. In conventional art, one physical array 100 of the NOR Flash memory has a plurality of memory blocks Block<0>-Block<n>. The memory blocks Block<0>-Block<n> share same bit line BL<0>-BL<M>, source lines, and a P-type well, and the memory blocks Block<0>-Block<n> receive word lines WL<0>-WL<q>. If an erase operation is carried out on one memory block without applying a post-program operation, a leakage current from bit lines BL<0>-BL<M> may be caused. Due to the leakage current from the bit lines BL<0>-BL<M>, some mistakes may occur when a read "0" operation is operated on another memory block.

In detail, the erase operation operated on the NOR flash memory is processed as pre-program, erase, and post-program operations in sequence. If an operation power voltage of the memory block drops before the post-program operation has been completed, current from the bit lines BL<0>-BL<M> may leak, and a read mistake on another memory block may occur.

In the conventional art, after the NOR flash memory has been powered up, the user needs to wait for the NOR flash memory to complete the post-program operation. The waiting time is noticeable and significant.

SUMMARY OF THE INVENTION

The disclosure concerns a recover and read method for a NOR flash memory apparatus, which can prevent leakage current from bit lines due to a post-program operation not being completely carried out.

The disclosure provides the recover and read method including: operating a power-up process on the NOR flash memory apparatus during a power-up time period; operating a power-up reading operation during a reading time period after the power-up time period, and reading a mark bit of a memory block of the flash memory apparatus during the reading time period; and, applying a negative voltage to a plurality of un-selected word lines for the power-up reading operation to operate normally.

The disclosure further provides the NOR flash memory apparatus including a memory block, and a memory controller. The memory block is coupled to the memory controller. The memory controller is configured to: operate a power-up process on the NOR flash memory apparatus during a power-up time period; operate a power-up reading operation during a reading time period after the power-up time period, and read a mark bit of the memory block of the flash memory apparatus during the reading time period; and apply a negative voltage to a plurality of un-selected word lines for the power-up reading operation to operate normally.

According to the above descriptions, a negative voltage is applied to a plurality of un-selected word lines for the power-up reading operation to operate normally. That is, the leakage current from the bit lines of the memory block can be prevented due to the negatively biased word lines, and a read mistake can correspondingly be prevented.

In order to aid in understanding of the aforementioned and other features and advantages of the invention, several exemplary embodiments, which are accompanied with figures, are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
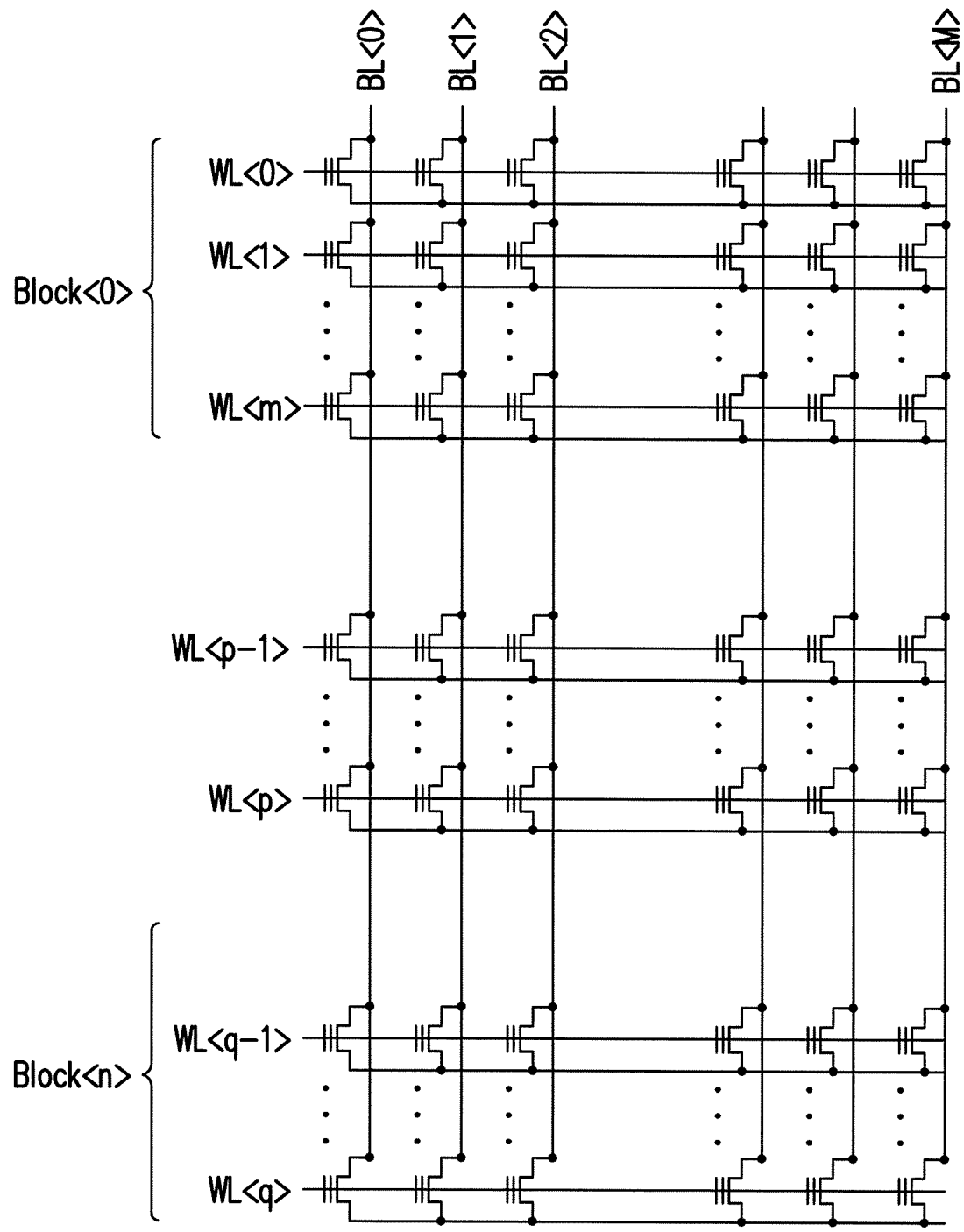
FIG. 1 is a schematic diagram of a conventional NOR flash memory.
Figure 2:
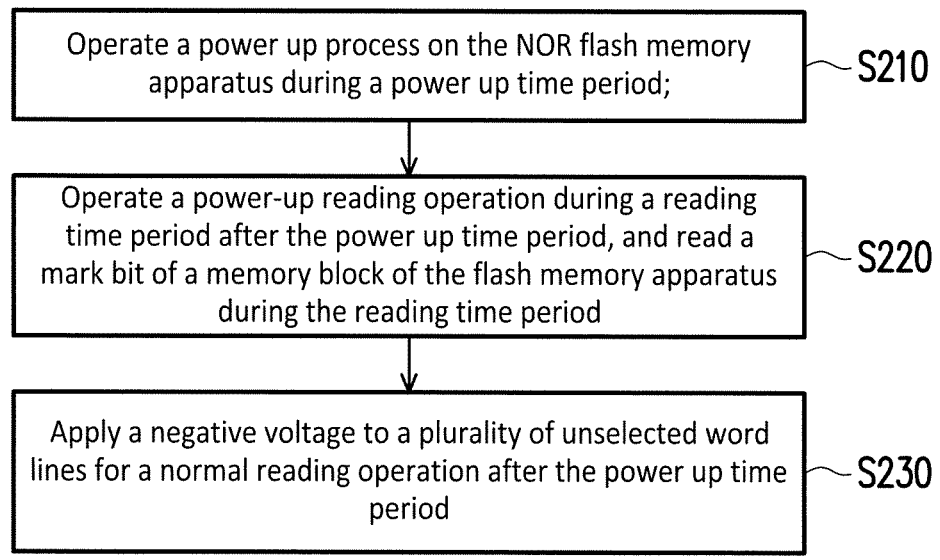
FIG. 2 is a flow chart of a recover and read method according to an embodiment of the present disclosure.

The following refers to FIG. 2, which is a flow chart of a recover and read method according to an embodiment of the present disclosure. The recover and read method is adapted for a NOR flash memory apparatus. In a step S210 a power-up process is operated on the NOR flash memory apparatus during a power-up time period. Then, in a step S220 a power-up reading operation is operated during a reading time period after the power-up time period, and a mark bit of a memory block in a memory array of the flash memory apparatus is read during the reading time period. In a step S230 a negative voltage is applied to a plurality of un-selected word lines for the power-up reading operation to operate normally.

Figure 3:
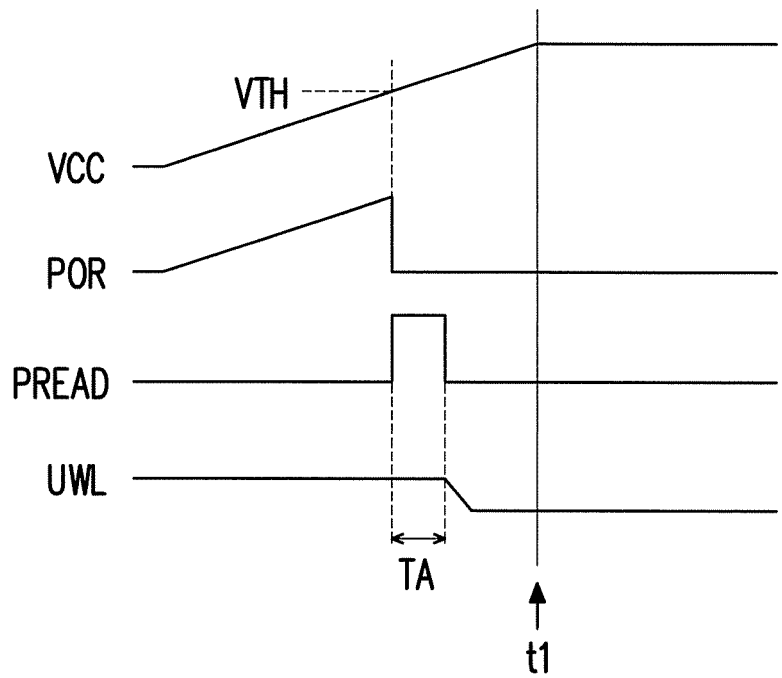
FIG. 3 is a waveform plot of the recover and read method according to an embodiment of the present disclosure.

The following explains in detail steps S210 to S230 of FIG. 2 and also refers to FIG. 3, which is a waveform plot of the recover and read method according to an embodiment of the present disclosure. During the power-up process, an operation power voltage VCC gradually increases from a low voltage level (i.e. 0 V) to a pre-set voltage level. At the same time, a voltage level of the operation power voltage VCC is sensed and a power-on detection signal POR is generated accordingly. Here, if the voltage level of the operation power voltage VCC is lower than a threshold voltage VTH, a voltage level of the power-on detection signal POR is gradually raised. Conversely, if the voltage level of the operation power voltage VCC is higher than the threshold voltage VTH, the voltage level of the power-on detection signal POR is pulled to a low voltage level (i.e. 0 V). The power-up time period can then be determined by the voltage level of the power-on detection signal POR. The power-up time period is started when the voltage level of the power-on detection signal POR starts to rise and the power-up time period is stopped when the voltage level of the power-on detection signal POR drops to the low voltage level.

The reading time period TA is started when the voltage level of the operation power voltage VCC is higher than the threshold voltage VTH. The power-up reading operation is carried out during the reading time period TA according to a power-on reading signal PREAD, and the mark bit of the memory block in the memory array can be read during the reading time period TA. By sensing a value of the mark bit, whether the corresponding memory block has been operated on with a post-program operation can be determined. If, as determined by the mark bit, the corresponding memory block has not been operated on with the post-program operation, a negative voltage is applied to a plurality of un-selected word lines UWL for the power-up reading operation to operate normally, the power-up reading operation operating after the power-up time period TA (for example, at a time point W. Consequently, leakage current from bit lines of the memory array is prevented, and the power-up reading operation may operate normally without causing mistakes.

Please note that the mark bit may be stored in the memory block, and is used to record whether the corresponding memory block is erased or not. In this embodiment, when the corresponding memory block is erased, the mark bit is set to a first logic level. On the other hand, the mark bit is cleared to a second logic level when the corresponding memory block is operated on with the post-program operation. The first logic level is complementary to the second logic level.

Furthermore, in the present embodiment, it is not necessary to perform the post-program operation on the memory block immediately after the reading time period TA. Thus, the memory array can be accessed immediately without needing to wait.

Figure 4:
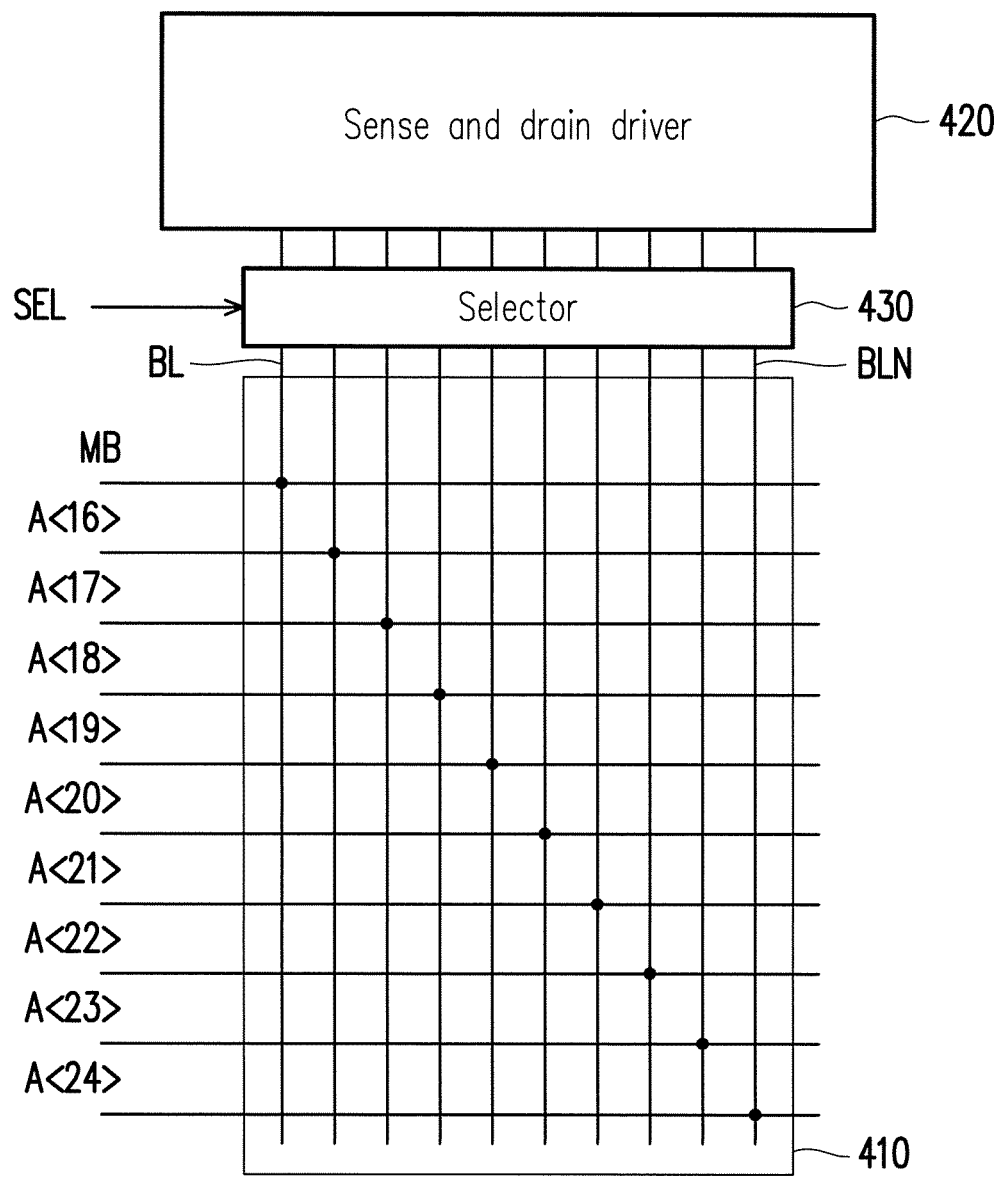
FIG. 4 is a schematic diagram of a NOR memory apparatus, which may be operated on with pre-program, erase and post-program operations according to an embodiment of the present disclosure.

The following refers to FIG. 4, which is a schematic diagram of a NOR memory apparatus, which may be operated on with pre-program, erase and post-program operations according to an embodiment of the present disclosure. In FIG. 4, the NOR memory apparatus includes a memory block 410, a sense and drain driver 420 and a selector 430. The sense and drain driver 420 is coupled to the selector 430, and provides drive signals to bit lines BL1-BLN through the selector 430 according to the selection signal SEL.

The memory block 410 is coupled to the bit lines BL1-BLN and receives signals A<16>-A<24> of word lines and MB. The signals A<16>-A<24> of the word lines may be address signals for reading operations and program operations. The word line signal MB can be used to program or read the mark bit.

During the pre-program operation or the post-program operation, all of the bit lines BL1-BLN are selected by the selector 430, and the sense and drain driver 420 sets all of the bit lines BL1-BLN to a first voltage VPPD. At the same time, the signals A<16>-A<24> of the world lines and MB are set to a second voltage VPPI, and a well of the memory block 410 is pulled to a ground voltage (i.e. 0 V). The first voltage VPPD and the second voltage VPPI have high voltage level relative to the ground voltage, and memory cells on the memory block 410 can be programmed.

It should be noted that when the post-program operation has been completed, the mark bit is cleared.

On the other hand, during the erase operation, all of the bit lines BL1-BLN are floated by the selector 430. The well of the memory block 410 is set to the second voltage VPPI, and the word line signal MB is set to a relative low voltage VEEI. Furthermore, the voltage levels of the signals A<16>-A<24> of the word lines are set according to corresponding logic levels. That is, if a signal of the signals A<16>-A<24> of the world lines corresponds to logic "1", the voltage level of the signal of the signals A<16>-A<24> of the word lines is set to the voltage VEEI. Conversely, if a signal of the signals A<16>-A<24> of the word lines corresponds to logic "0", the voltage level of the signal of the signals A<16>-A<24> of the word lines is set to the second voltage VPPI.

During the erase operation, the mark bit is erased to an uncleared state, and the mark bit may then be used to identify that the memory block 410 has been erased.

Figure 5:
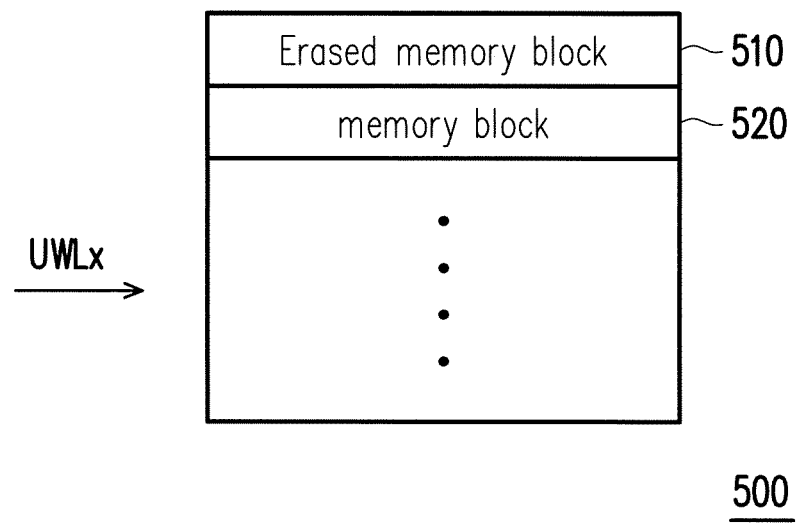
FIG. 5 is a schematic diagram showing a power-up reading operation operating normally according to an embodiment of the present disclosure.

The following refers to FIG. 5, which is a schematic diagram showing a power-up reading operation operating normally according to an embodiment of the present disclosure. After completion of the power-up reading operation on an erased memory block 510, the un-selected word lines UWLx of the memory array 500 are set to a negative voltage. Consequently, leakage current from the bit lines of the memory array 500 is prevented, and the power-up reading operation on the memory block 520 may operate normally without causing mistakes.

Figure 6:
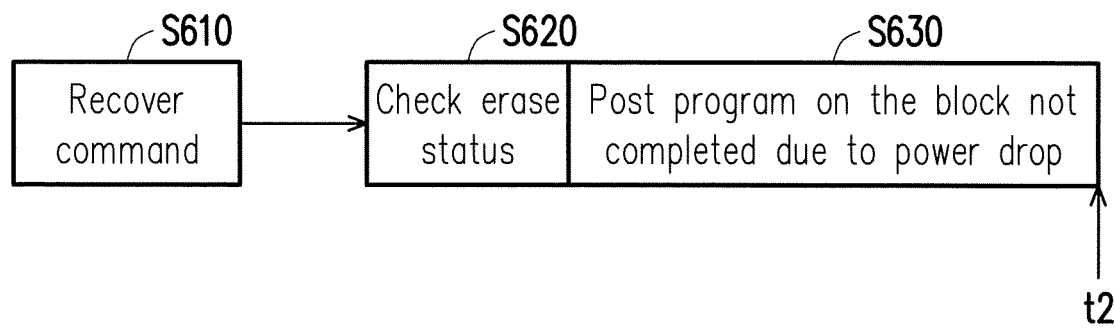
FIG. 6 is a flow chart of a post-program operation according to an embodiment of the present disclosure.

The following refers to FIG. 6, which is a flow chart of a post-program operation according to an embodiment of the present disclosure. In this embodiment, the post-program operation need not to be operated immediately after the power-up reading operation. In FIG. 6, the post-program operation is activated by a recover command. If the recover command is received at a step S610, the NOR flash memory checks an erase status of a memory block according to the mark bit of the memory block (step S620). If the mark bit is not in a cleared state, it can be seen that the corresponding memory block has not been operated on with the post-program operation due to a power drop, and the erase operation on the corresponding memory block has not been completed. Accordingly, the corresponding memory block is operated on with the post-program operation in a step S630. The post-program operation is completed at time point t2, and the mark bit of the corresponding memory block is cleared at the time point t2.

Figure 7:
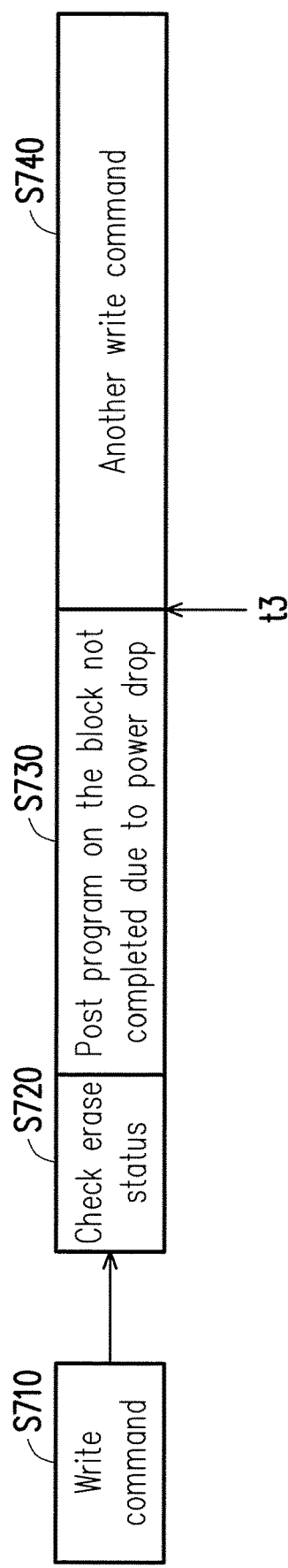
FIG. 7 is a flow chart of another post-program operation according to an embodiment of the present disclosure.

The following refers to FIG. 7, which is a flow chart of another post-program operation according to an embodiment of the present disclosure. In this embodiment, the post-program operation need not be operated immediately after the power-up reading operation. In FIG. 7, the post-program operation is activated by a write command. That is, when the write command is received by the NOR memory apparatus in a step S710, the NOR memory apparatus checks the erase status of the memory block in a step S720. The erase status is checked according to the mark bit of the corresponding memory block. If the mark bit is not in the cleared state, the corresponding memory block is operated on with the post-program operation in a step S730. At the time point t3 when the post-program operation has been completed, the mark bit of the corresponding memory block is cleared. After the time point t3 when the post-program operation has been completed, another write command may be received in a step S740.

Figure 8:
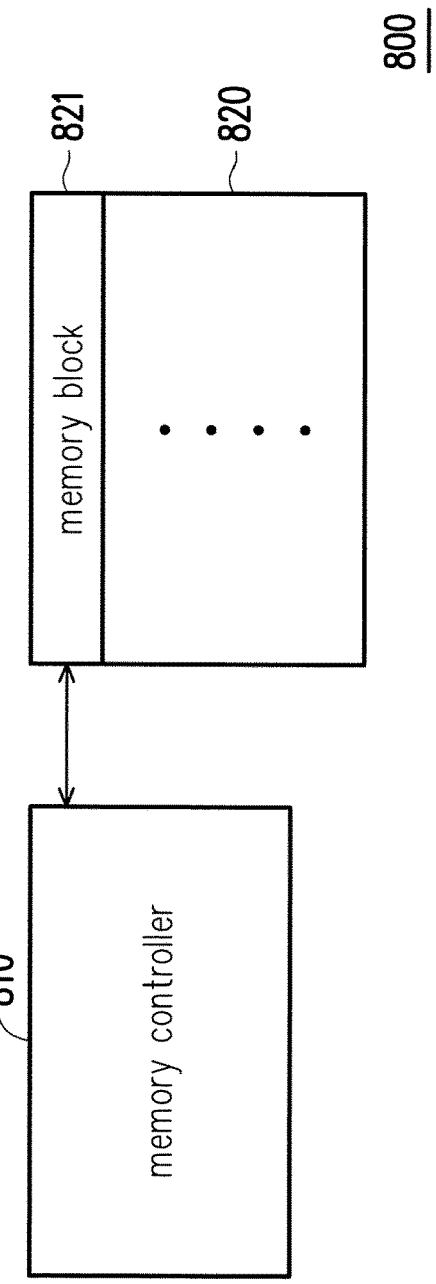
FIG. 8 is a block diagram of a NOR flash memory apparatus according to an embodiment of the present disclosure.

The following refers to FIG. 8, which is a block diagram of a NOR flash memory apparatus according to an embodiment of the present disclosure. The NOR flash memory apparatus 800 includes a memory controller 810 and one or more memory arrays 820. The memory controller 810 is coupled to the memory array 820. The memory array 820 includes a plurality of memory blocks 821. The memory controller 810 is configured to: operate a power-up process on the NOR flash memory apparatus 800 during a power-up time period; operate a power-up reading operation during a reading time period after the power-up time period, and read a mark bit of the memory block 821 of the flash memory apparatus during the reading time period; and apply a negative voltage to a plurality of un-selected word lines for the power-up reading operation to operate normally.

The detailed actions of the memory controller 810 have been described in the embodiments described above, and will not be described here again.

Furthermore, in some embodiments, the memory blocks 821 may be utilized by a plurality of memory sectors.

In summary, a negative voltage is applied to un-selected word lines after the power-up reading operation. The post-program operation need not be operated immediately, and leakage current from the bit lines due to voltage drop can be prevented. Consequently, the power-up reading operation may be operated normally without mistakes and without waiting for the post-program operation, resulting in an improved efficiency of the NOR flash memory.

It will be apparent to those skilled in the art that various modifications and variations can be made to the embodiments and concepts disclose herein without departing from the scope or spirit of the invention. In view of the foregoing, it is intended that the invention cover modifications and variations of this invention provided they fall within the scope of the following claims and their equivalents.

What is claimed is:

1. A recover and read method, adapted for a NOR flash memory apparatus, comprising:
   operating a power-up process on the NOR flash memory apparatus to raise a voltage level of an operation power voltage from 0V to a threshold voltage during a first time period; and
   operating a power-up reading operation during a second time period after the first time period when a logic level of a power on reading signal equals to a specific logic level, wherein the power-up reading operation comprises:
   reading a mark bit that is stored in a memory block in a memory array of the flash memory apparatus during the second time period; and
   in response to determining that the mark bit indicates the memory block has not been erased, applying a negative voltage to a plurality of un-selected word lines during a third time period,
   wherein the second time period is earlier than the third time period and an end time of the second time period is earlier than a finish time point of the power-up process, wherein the voltage level of the operation power voltage is raised to a target voltage level at the finish time point.

2. The recover and read method as claimed in claim 1, wherein the mark bit is used to record whether the corresponding memory block is erased or not.

3. The recover and read method as claimed in claim 1, wherein operating the power-up process on the NOR flash memory apparatus during the first period comprises:
   raising an operation power voltage from 0 V to a pre-set voltage level; and
   sensing the voltage level of the operation power voltage, and setting the first time period in response to determining that the voltage level of the operation power voltage is higher than the threshold voltage.

4. The recover and read method as claimed in claim 3, wherein operating the power-up reading operation after the first time period comprises:
   operating the power-up reading operation when the voltage level of the operation power voltage is higher than the threshold voltage.

5. The recover and read method as claimed in claim 1, further comprising:
   receiving a recover command; and
   deciding whether to operate a post-program operation on the memory block according to the recover command and the mark bit.

6. The recover and read method as claimed in claim 5, wherein deciding whether to operate the post-program operation on the memory block according to the recover command and the mark bit comprises:
   if the mark bit is not in the cleared state, operating the post-program operation on the memory block according to the recover command and the mark bit.

7. The recover and read method as claimed in claim 6, further comprising:
   clearing the mark bit after the post-program operation on the memory block has been completed.

8. The recover and read method as claimed in claim 1, further comprising:
   receiving a write command; and
   deciding whether to operate a post-program operation on the memory block according to the write command and the mark bit.

9. The recover and read method as claimed in claim 8, wherein deciding whether to operate the post-program operation on the memory block according to the write command and the mark bit comprises:
   if the mark bit is not in a cleared state, operating the post-program operation on the memory block according to the write command and the mark bit.

10. The recover and read method as claimed in claim 9, further comprising:
    clearing the mark bit after the post-program operation on the memory block has been completed.

11. A NOR flash memory apparatus, comprising:
    at least one memory array each having at least one memory block;
    a memory controller, coupled to the at least one memory block, the memory controller being configured to:
    operate a power-up process on the NOR flash memory apparatus to raise a voltage level of an operation power voltage from 0V to a threshold voltage during a first time period; and
    operate a power-up reading operation during a second time period after the first time period when a logic level of a power on reading signal equals to a specific logic level, wherein the power-up reading operation comprises:
    reading a mark bit that is stored in the memory block of the flash memory apparatus during the second time period; and
    in response to determining that the mark bit indicates the memory block has not been erased, applying a negative voltage to a plurality of un-selected word lines during a third time period,
    wherein the second time period is earlier than the third time period and an end time of the second time period is earlier than a finish time point of the power-up process, wherein the voltage level of the operation power voltage is raised to a target voltage level at the finish time point.

12. The NOR flash memory apparatus as claimed in claim 11, wherein the mark bit is used to record whether the corresponding memory block is erased or not.

13. The NOR flash memory apparatus as claimed in claim 11, wherein the memory controller senses the voltage level of the operation power voltage of the memory block, and sets the first time period in response to determining that the voltage level of the operation power voltage is higher than the threshold voltage.

14. The NOR flash memory apparatus as claimed in claim 13, wherein the memory controller operates the power-up reading operation when the voltage level of the operation power voltage is higher than the threshold voltage.

15. The NOR flash memory apparatus as claimed in claim 11, wherein the memory controller further receives a recover command, and decides whether to operate a post-program operation on the memory block according to the recover command and the mark bit.

16. The NOR flash memory apparatus as claimed in claim 15, wherein the memory controller operates the post-program operation on the memory block according to the recover command and the mark bit if the mark bit is not in the cleared state.

17. The NOR flash memory apparatus as claimed in claim 16, wherein the memory controller further clears the mark bit after the post-program operation on the memory block has been completed.

18. The NOR flash memory apparatus as claimed in claim 11, wherein the memory controller further receives a write command, and decides whether to operate a post-program operation on the memory block according to the write command and the mark bit.

19. The NOR flash memory apparatus as claimed in claim 18, wherein the memory controller operates the post-program operation on the memory block according to the write command and the mark bit if the mark bit is not in a cleared state.

20. The NOR flash memory apparatus as claimed in claim 19, wherein the memory controller clears the mark bit after the post-program operation on the memory block has been completed.

* * * * *